United States Patent
Hadi et al.

(10) Patent No.: US 10,724,358 B2
(45) Date of Patent: Jul. 28, 2020

(54) ANTI-STICK-SLIP SYSTEMS AND METHODS

(71) Applicant: Nabors Drilling Technologies USA, Inc., Houston, TX (US)

(72) Inventors: Mahmoud Hadi, Richmond, TX (US); Brian Ellis, Spring, TX (US)

(73) Assignee: NABORS DRILLING TECHNOLOGIES USA, INC., Houston, TX (US)

( * ) Notice: Subject to any disclaimer, the term of this patent is extended or adjusted under 35 U.S.C. 154(b) by 412 days.

(21) Appl. No.: 15/730,367

(22) Filed: Oct. 11, 2017

(65) Prior Publication Data
US 2019/0106979 A1    Apr. 11, 2019

(51) Int. Cl.
| | |
|---|---|
| *E21B 44/08* | (2006.01) |
| *G05D 19/02* | (2006.01) |
| *E21B 44/04* | (2006.01) |
| *E21B 44/02* | (2006.01) |
| *G06F 30/00* | (2020.01) |

(52) U.S. Cl.
CPC .............. *E21B 44/08* (2013.01); *E21B 44/02* (2013.01); *E21B 44/04* (2013.01); *G05D 19/02* (2013.01); *G06F 30/00* (2020.01)

(58) Field of Classification Search
CPC .......... G06F 30/00; G06F 17/50; E21B 44/08; E21B 44/02; E21B 44/04; G05D 19/02
See application file for complete search history.

(56) References Cited

U.S. PATENT DOCUMENTS

| | | | |
|---|---|---|---|
| 2008/0156531 A1* | 7/2008 | Boone .................. | E21B 7/06 175/27 |
| 2009/0078462 A1* | 3/2009 | Boone .................. | E21B 7/068 175/26 |
| 2014/0158432 A1* | 6/2014 | Simpson ............ | E21B 17/1057 175/73 |

FOREIGN PATENT DOCUMENTS

| | | |
|---|---|---|
| CA | 2035823 A1 | 2/1991 |
| WO | 2008/070829 A3 | 6/2008 |
| WO | 2010/064031 A1 | 6/2010 |

(Continued)

OTHER PUBLICATIONS

Fouad, Tarek Ahmed et al. "An Optimized Chattering Free Sliding Mode Controller to Suppress Torsional Vibrations in Drilling Strings", Feb. 19-22, 2011, IEEE GCC Conference and Exhibition, IEEE (Year: 2011).*

(Continued)

*Primary Examiner* — Cedric Johnson
(74) *Attorney, Agent, or Firm* — Haynes and Boone, LLP

(57) ABSTRACT

Systems and methods for reducing or eliminating stick-slip are described. The system includes a controller and a drawworks. The controller is configured to collect downhole information, detect one or more stick-slip conditions, determine correlative relationships, model a stick-slip region, generate a control algorithm for top drive RPM and WOB that avoids a stick-slip region, determine a WOB autodriller set point for a particular top drive RPM using the control algorithm and provide one or more operational control signals that limit the WOB to the WOB autodriller set point for the particular top drive RPM. The drawworks is configured to receive the one or more operational control signals from the controller, and limit the WOB so that the WOB does not exceed the WOB autodriller set point for the particular top drive RPM.

19 Claims, 6 Drawing Sheets

(56) References Cited

FOREIGN PATENT DOCUMENTS

WO      2013/112056 A1    8/2013
WO      2014/147116       9/2014

OTHER PUBLICATIONS

Boyadjieff, George et al. "Design Considerations and Field Performance of an Advanced Automatic Driller", Feb. 19-21, 2003, SPE/IADC Drilling Conference, Society of Petroleum Engineers. (Year: 2003).*

Emudiaga, Odesa David et al, "Torsional and Lateral Vibrations of Polycrystalline Diamond Compact PDC Bits in Directional Drilling", Aug. 2-4, 2016, SPE Nigeria Annual Conference and Exhibition, Society of Petroleum Engineers. (Year: 2016).*

Feng, Tianheng et al., "Dynamic Programming Based Controllers to Suppress Stick-Slip in a Drilling System", May 24-26, 2017, American Control Conference, AACC. (Year: 2017).*

Liu, Yang, "Sliding-Mode Control of an Underactuated Oilwell Drill-String with Parametric Uncertainty", Jul. 9-11, 2014, UKACC International Conference on Control, IEEE. (Year: 2014).*

\* cited by examiner

ANTI-STICK-SLIP SYSTEMS AND METHODS

TECHNICAL FIELD

The present disclosure is directed to systems, devices, and methods for reducing down hole stick-slip vibrations. More specifically, the present disclosure is directed to systems, devices, and methods for limiting the weight on bit (WOB) set point of an automatic driller based on the rotations per minute (RPM) or rotary speed of the top drive.

BACKGROUND OF THE DISCLOSURE

Underground drilling involves drilling a bore through a formation deep in the Earth using a drill bit connected to a drill string. During rotary drilling, the torque applied at a top drive of a drilling rig is often out of phase with the rotational movement at the bottom-hole assembly (BHA) of the drill string due to an elasticity of the material of the drill string. This causes the drill string to yield somewhat under the opposing loads imposed by the rotational force at the top drive and friction/inertia at the end where the bit is located (e.g., the BHA). This causes resonant motion to occur between the top drive and the BHA that is undesirable. Further, as the drill string winds up along its length due to the ends being out of phase, the torque stored in the winding may exceed the static friction force when the bit is sticking, causing the drill string near the bit to slip relative to the wellbore sides at a high (and often damaging) speed.

"Stick-slip" is a downhole condition where torsional vibrations have increased because the bit and BHA are experiencing increased friction and drag at the bit, causing the bit to stop rotating. Once the bit has stopped rotating, torque tends to build up in the drill string. The torque buildup causes the energy in the drill string to increase until it overcomes the drag friction between the bit/BHA and the formation, which frees the bit momentarily until the drag friction overcomes the rotational energy in the drill string again. This causes a periodic motion called stick-slip.

Stick-slip is a major contributing factor to excessive bit wear, as well as damage to motors, downhole tools, and the BHA. Torsional vibration can have the effect that cutters on the drill bit may momentarily stop or be rotating backwards, i.e., in the reverse rotational direction to the normal forward direction of rotation of the drill bit during drilling. This is followed by a period of forward rotation of many times the RPM mean value.

Measured torque of the drill string may be used in addition to other techniques to adjust a rotation speed during the rotary drilling to reduce the chance of stick-slip and/or other vibrations. In an approach, impedance between the top drive and the drill string (i.e., any torsional waves traveling up the drill string) is sought to be matched by analyzing RPM feedback from an encoder of a motor (e.g., a motor in a top drive or rotary table). As a result, the drive (e.g., a variable-frequency drive) is detuned to achieve as near to a constant torque as possible, resulting in changes to RPM of the top drive. Another approach is more active in changing speed to match impedance between the top drive and the drill string. The RPM value for the top drive is adjusted based on the feedback obtained from torque. Matching impedance by itself, however, will not eliminate all stick-slip occurrences. In addition, these approaches can result in significant swings in top drive RPM speed, creating concern of damage to the drill string and the top drive when the swing is particularly large.

Thus, what are needed are systems, apparatuses, and methods that provide more effective ways to reduce stick-slip conditions from happening in the first place.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
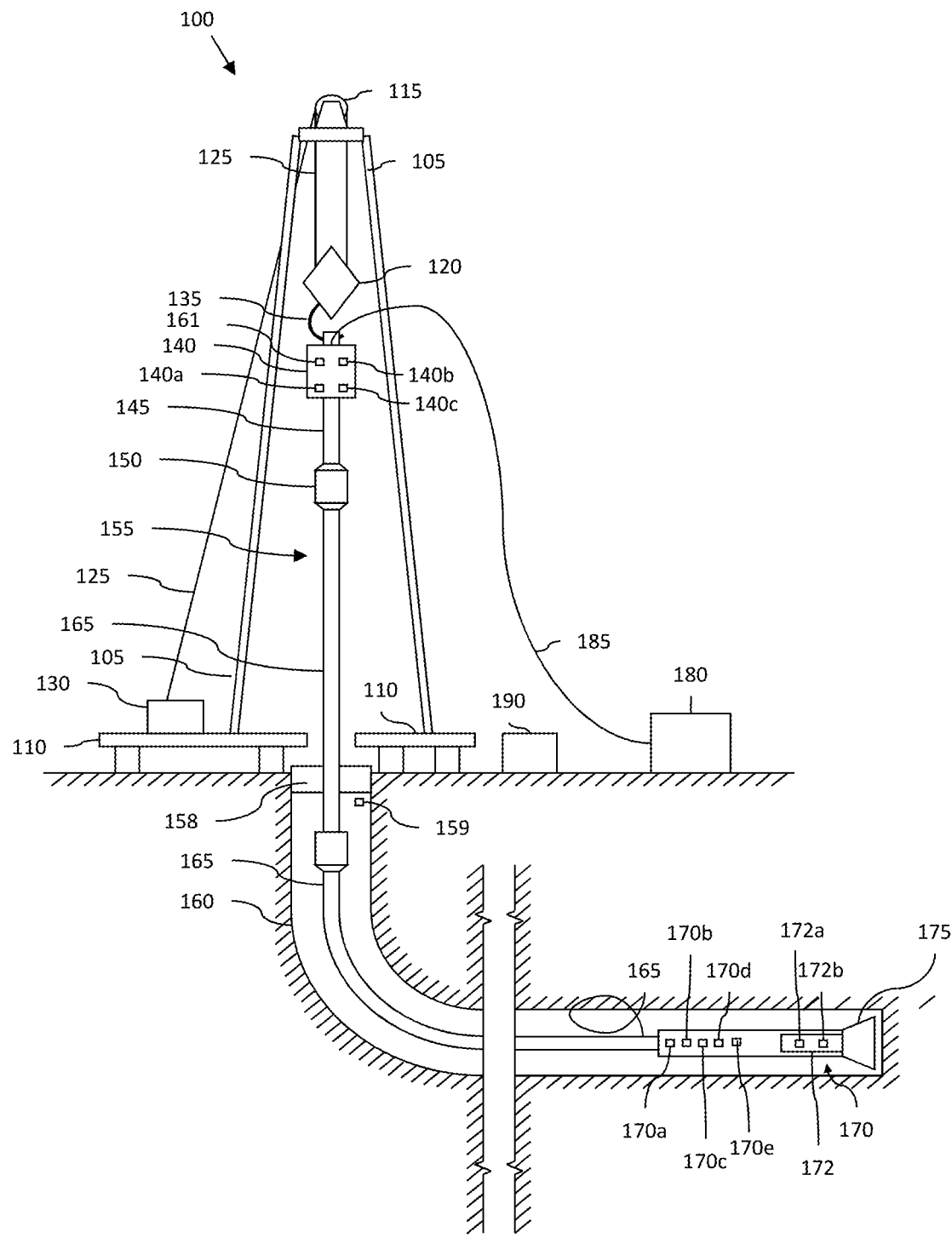
FIG. 1 is a diagram of an apparatus shown as an exemplary drilling rig according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure provides apparatuses, systems, and methods for reducing or mitigating stick-slip conditions based on a model formulated from downhole drilling parameters. For example, drilling parameters may include, but are not limited to, any of RPM, WOB, measured depth (MD), hole angle, hole diameter, characteristics of the drill bit and drill string, mud weight, mud flow rate, mud viscosity, rock properties, lithology of the formation, pore pressure of the formation, torque, pressure, temperature, rate of penetration, mechanical specific energy, and/or combinations thereof. Various parameters may be directly measured or must be indirectly measured, calculated, estimated, or otherwise inferred from available data. The devices, systems, and methods allow a user (alternately referred to herein as an "operator") to provide or change a drilling parameter that improves the drilling operation to reduce occurrences of stick-slip.

Based on studies and data analysis on drilling data and downhole sensors, stick-slip can be reduced by manipulating drilling parameters, such as RPM and WOB. In general, increasing RPM helps increase the drill string to not reach sticking velocity thus it will reduce stick-slip. Reducing WOB also helps reduce stick-slip by reducing the torque needed for the bit to stick. The WOB, however, cannot be reduced substantially or else the rate of penetration (ROP) decreases.

In various embodiments, one or more supervisory algorithms model regions of stick-slip (including regions of severe stick-slip) to predict the BHA response to possible changes in RPM and WOB. The supervisory algorithm(s) can then schedule the WOB and RPM values used in a drilling operation to avoid these stick-slip regions. The WOB set point to the auto driller (i.e., the maximum WOB that can be used) is determined based on top drive RPM. In some embodiments, the one or more supervisory algorithms also model how the stick-slip regions will change if stick-slip mitigation technologies (such as Soft Torque) are enabled to ensure that the algorithm(s) will not interfere with this technology's operation.

Advantageously, the modeled stick-slip regions provide constraints that allow a driller or operator to operate in a safe environment (i.e., with little to no stick-slip). The WOB and RPM that generate the maximum ROP may be sought and communicated to operator or the autodriller. RPM and WOB are optimized to maximize ROP, but without inducing stick-slip.

By drilling or drill string, this term is generally also meant to include any tubular string. In one embodiment, the term drilling can include casing drilling, and drill string includes a casing string.

Referring to FIG. 1, illustrated is a schematic view of apparatus 100 demonstrating one or more aspects of the present disclosure. The apparatus 100 is or includes a land-based drilling rig. However, one or more aspects of the present disclosure are applicable or readily adaptable to any type of drilling rig, such as jack-up rigs, semisubmersibles, drill ships, coil tubing rigs, well service rigs adapted for drilling and/or re-entry operations, and casing drilling rigs, among others within the scope of the present disclosure.

Apparatus 100 includes a mast 105 supporting lifting gear above a rig floor 110. The lifting gear includes a crown block 115 and a traveling block 120. The crown block 115 is coupled at or near the top of the mast 105, and the traveling block 120 hangs from the crown block 115 by a drilling line 125. The drilling line 125 extends from the lifting gear to drawworks 130, which is configured to reel out and reel in the drilling line 125 to cause the traveling block 120 to be lowered and raised relative to the rig floor 110.

A hook 135 is attached to the bottom of the traveling block 120. A top drive 140 is suspended from the hook 135. A quill 145 extending from the top drive 140 is attached to a saver sub 150, which is attached to a tubular string 155 suspended within a wellbore 160. Alternatively, the quill 145 may be attached to the tubular string 155 directly.

The tubular string 155 includes interconnected sections of tubular 165, a BHA 170, and a drill bit 175. The bottom hole assembly 170 may include stabilizers, drill collars, and/or measurement-while-drilling (MWD) or wireline conveyed instruments, among other components. The drill bit 175, which may also be referred to herein as a tool, is connected to the bottom of the BHA 170 or is otherwise attached to the tubular string 155. One or more pumps 180 may deliver fluid to the tubular string 155 through a conduit 185, which may be connected to the top drive 140. The conduit 185 includes a rig standpipe and hose that connect the pumps 180 to the top drive 140. In an embodiment, the rig standpipe includes a sensor to measure surface standpipe pressure. Mud motor differential pressure (DP) may be calculated, detected, or otherwise determined at the surface by calculating the difference between the surface standpipe pressure just off-bottom and pressure once the bit touches bottom and starts drilling and experiencing torque. Standpipe pressure sensor 161 may be coupled or otherwise associated with the top drive system 140.

The downhole MWD or wireline conveyed instruments may be configured for the evaluation of physical properties such as pressure, temperature, torque, WOB, RPM, vibration, inclination, azimuth, toolface orientation in three-dimensional space, and/or other downhole parameters. These measurements may be made downhole, stored in solid-state memory for some time, and downloaded from the instrument(s) at the surface and/or transmitted to the surface. Data transmission methods may include, for example, digitally encoding data and transmitting the encoded data to the surface, possibly as pressure pulses in the drilling fluid or mud system, acoustic transmission through the tubular string 155, electronically transmitted through a wireline or wired pipe, and/or transmitted as electromagnetic pulses. MWD tools and/or other portions of the BHA 170 may have the ability to store measurements for later retrieval via wireline and/or when the BHA 170 is tripped out of the wellbore 160.

In an exemplary embodiment, the apparatus 100 may also include a rotating blow-out preventer (BOP) 158, such as if the well 160 is being drilled utilizing under-balanced or managed-pressure drilling methods. In such embodiment, the annulus mud and cuttings may be pressurized at the surface, with the actual desired flow and pressure possibly being controlled by a choke system, and the fluid and pressure being retained at the well head and directed down the flow line to the choke by the rotating BOP 158. The apparatus 100 may also include a surface casing annular pressure sensor 159 configured to detect the pressure in the annulus defined between, for example, the wellbore 160 (or casing therein) and the tubular string 155.

In the exemplary embodiment depicted in FIG. 1, the top drive 140 is utilized to impart rotary motion to the tubular string 155. However, aspects of the present disclosure are also applicable or readily adaptable to implementations utilizing other drive systems, such as a power swivel, a rotary table, a coiled tubing unit, a downhole motor, and/or a conventional rotary rig, among others.

The apparatus 100 also includes a controller 190 configured to control or assist in the control of one or more components of the apparatus 100. For example, the controller 190 may be configured to transmit operational control signals to the drawworks 130, the top drive 140, the BHA 170 and/or the pump 180. The controller 190 may be a stand-alone component installed near the mast 105 and/or other components of the apparatus 100. In an exemplary embodiment, the controller 190 includes one or more systems located in a control room proximate the apparatus 100, such as the general purpose shelter often referred to as the "doghouse" serving as a combination tool shed, office, communications center and general meeting place. The controller 190 may be configured to transmit the operational control signals to the drawworks 130, the top drive 140, the BHA 170 and/or the pump 180 via wired or wireless transmission means which, for the sake of clarity, are not depicted in FIG. 1.

The controller 190 is also configured to receive electronic signals via wired or wireless transmission means (also not shown in FIG. 1) from a variety of sensors included in the apparatus 100, where each sensor is configured to detect an operational characteristic or parameter. Examples of sensors include the speed sensors 140*b* and 170*e*, torque sensor 172*b*, pressure sensor 170*a*, and the WOB sensor 140*c* described below. In various embodiments, wired/networked drill string sensor data is used to obtain sensor readings for WOB, torque on bit (TOB), or other needed data.

The word "detecting," as used in the context of the present disclosure, may include detecting, sensing, measuring, calculating, and/or otherwise obtaining data. Similarly, the word "detect" in the context of the present disclosure may include detect, sense, measure, calculate, and/or otherwise obtain data.

The apparatus 100 may include a downhole annular pressure sensor 170*a* coupled to or otherwise associated with the BHA 170. The downhole annular pressure sensor 170*a* may be configured to detect a pressure value or range in the annulus-shaped region defined between the external surface of the BHA 170 and the internal diameter of the wellbore 160, which may also be referred to as the downhole pressure, casing pressure, downhole casing pressure, MWD casing pressure, or downhole annular pressure.

The apparatus 100 may additionally or alternatively include a shock/vibration sensor 170*b* that is configured for detecting shock and/or vibration in the BHA 170.

The apparatus 100 may additionally or alternatively include a mud motor DP sensor 172*a* that is configured to detect a pressure differential value or range across one or more motors 172 of the BHA 170. The one or more motors 172 may each be or include a positive displacement drilling motor that uses hydraulic power of the drilling fluid to drive the bit 175, also known as a mud motor. One or more torque sensors 172*b* may also be included in the BHA 170 for sending data to the controller 190 that is indicative of the torque applied to the bit 175 or TOB by the one or more motors 172.

The apparatus 100 may additionally or alternatively include any available toolface sensor 170*c* configured to detect the current toolface orientation. The toolface sensor 170*c* may be or include a conventional or future-developed "magnetic toolface," which detects toolface orientation relative to magnetic north or true north. Alternatively, or additionally, the toolface sensor 170*c* may be or include a conventional or future-developed "gravity toolface," which detects toolface orientation relative to the Earth's gravitational field. The toolface sensor 170*c* may also, or alternatively, be or include a conventional or future-developed gyro sensor.

The apparatus 100 may additionally or alternatively include a WOB sensor 170*d* integral to the BHA 170 and configured to detect WOB at or near the BHA 170.

The apparatus 100 may additionally or alternatively include a speed sensor 170*e* configured to detect rotational speed of the drill string at or near the BHA 170. In one embodiment, speed sensor 170*e* includes a magnetometer. Using the earth's magnetic field as a reference, the magnetometer can measure how fast the BHA is rotating, and the RPM of the BHA can then be calculated.

The apparatus 100 may additionally or alternatively include a torque sensor 140*a* coupled to or otherwise associated with the top drive 140. The torque sensor 140*a* may alternatively be located in or associated with the BHA 170. The torque sensor 140*a* may be configured to detect a value or range of the torsion of the quill 145 and/or the tubular string 155 (e.g., in response to operational forces acting on the tubular string). The top drive 140 may additionally or alternatively include or otherwise be associated with a speed sensor 140*b* configured to detect a value or range of the rotational speed of the quill 145.

The top drive 140, drawworks 130, crown or traveling block, drilling line or dead line anchor may additionally or alternatively include or otherwise be associated with a WOB sensor 140*c* (e.g., one or more sensors installed somewhere in the load path mechanisms to detect WOB, which can vary from rig-to-rig) different from the WOB sensor 170*d*. The WOB sensor 140*c* may be configured to detect a WOB value or range, where such detection may be performed at the top drive 140, drawworks 130, or other component of the apparatus 100. In some embodiments, the drawworks 130 contributes to a combined downward force applied to the drill bit 175, or the WOB. That is, the drawworks 130 may provide increasing lengths of drilling line 125 to the crown block 115 and the traveling block 120, increasing the WOB available for cutting forcefully into the formation.

An autodriller may be present on the apparatus 100 for controlling the drawworks 130 in response to the monitored performance of the apparatus 100. That is, when the performance of the apparatus 100 falls below a certain desired performance threshold, the autodriller may utilize a processor and programming to automatically control the drawworks 130 to increase WOB in order to increase the performance.

The detection performed by the sensors described herein may be performed once, continuously, periodically, and/or at random intervals. The detection may be manually triggered by an operator or other person accessing a human-machine interface (HMI), or automatically triggered by, for example, a triggering characteristic or parameter satisfying a predetermined condition (e.g., expiration of a time period, drilling progress reaching a predetermined depth, drill bit usage reaching a predetermined amount, etc.). Such sensors and/or other detection means may include one or more interfaces which may be local at the well/rig site or located at another, remote location with a network link to the system.

FIG. 1 shows an exemplary deviation of the wellbore 160 from a straight path achieved by directional drilling. To properly steer the mud motor 175, an operator terminates rotation of the tubular string 155 and typically determines the toolface orientation, for example, by monitoring data from downhole MWD sensors. The operator then rotates the tubular string 155 through a certain angle to achieve the toolface orientation for the new drilling direction. As the tubular string 155 is held still, the mud motor 175 proceeds at the angle from the end of the tubular string 155. Thus, the wellbore 160 can advance along a curved path. A straight path can again be drilled by resuming continuous rotation of the tubular string 155.

The tubular string 155 acts as a torsional spring with properties determined in part from the string length and cross sectional area. When the top drive 140 rotates, the tubular string 155 typically "twists" significantly along its length before the end of the tubular string 155 at the downhole motor 175 starts to rotate. The amount of rotation at the top drive 140 necessary to achieve rotation at the downhole motor 175 also varies according to the reactive torque imparted along the length of the tubular string 155.

Figure 2:
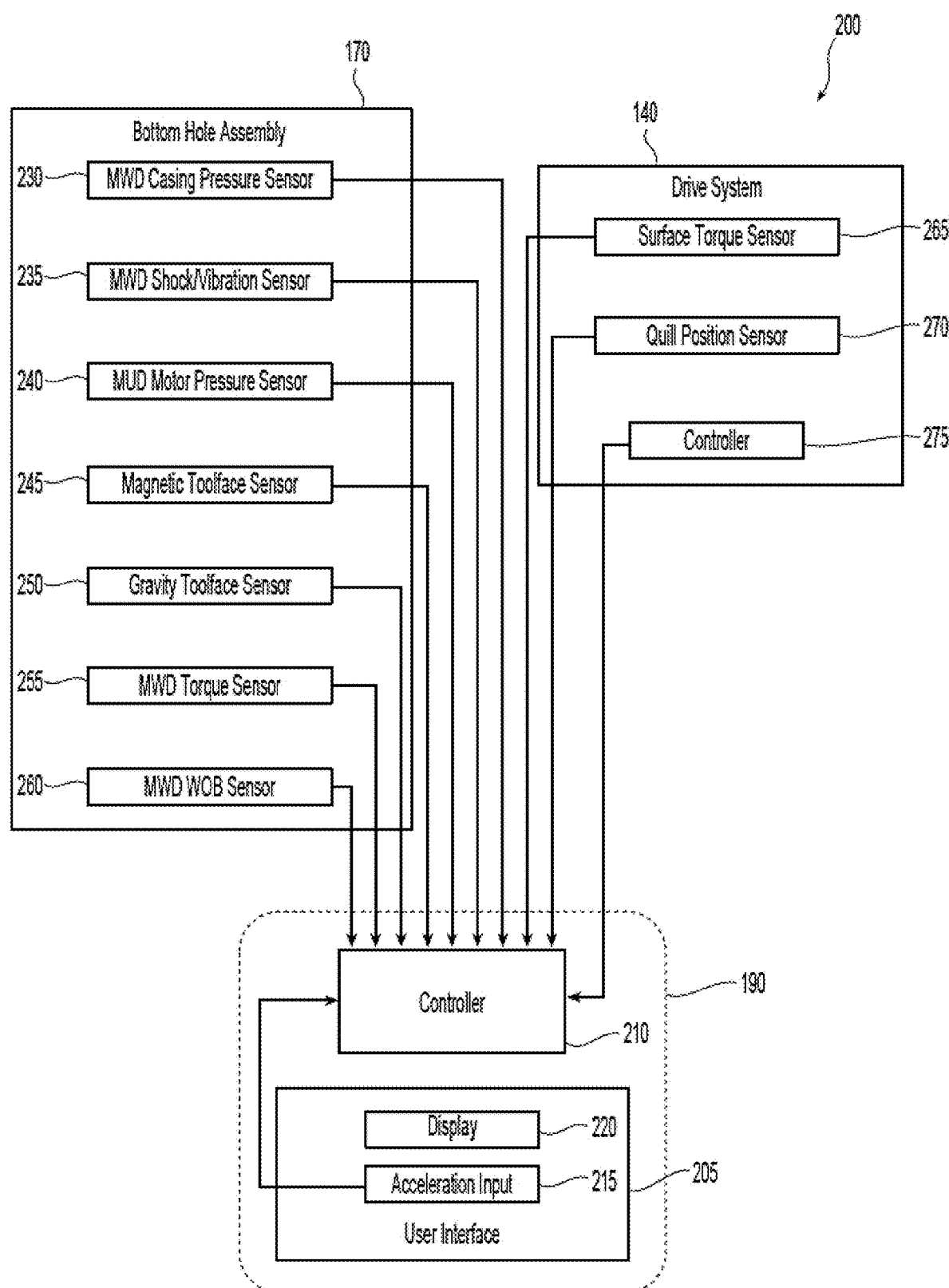
FIG. 2 is a block diagram of an apparatus shown as an exemplary control system according to one or more aspects of the present disclosure.

FIG. 2 illustrates a block diagram of a portion of an apparatus 200 according to one or more aspects of the present disclosure. FIG. 2 shows the control system 190, the BHA 170, and the top drive or drive system 140. The apparatus 200 may be implemented within the environment and/or the apparatus shown in FIG. 1.

The control system 190 includes a user-interface 205 and a controller 210. Depending on the embodiment, these may be discrete components that are interconnected via wired or wireless means. Alternatively, the user-interface 205 and the controller 210 may be integral components of a single system.

The user-interface 205 includes an input mechanism 215 for user-input of one or more drilling settings or parameters, such as acceleration, WOB set points, desired toolface orientation, toolface set points, toolface setting limits, rotation settings (e.g., RPM at the top drive) and other set points or input data. Further, a user may input information relating to the drilling parameters of the drill string 155, such as BHA 170 information or arrangement, drill pipe size, bit type, depth, formation information, and drill pipe material, among other things. These drilling parameters are useful, for example, in determining a composition of the drill string 155 to reduce stick-slip.

The input mechanism 215 may include a keypad, voice-recognition apparatus, dial, button, switch, slide selector, toggle, joystick, mouse, data base and/or other conventional or future-developed data input device. Such an input mechanism 215 may support data input from local and/or remote locations. Alternatively, or additionally, the input mechanism 215 may permit user-selection of predetermined profiles, algorithms, set point values or ranges, such as via one or more drop-down menus. The data may also or alternatively be selected by the controller 210 via the execution of one or more database look-up procedures. In general, the input mechanism 215 and/or other components within the scope of the present disclosure support operation and/or monitoring from stations on the rig site as well as one or more remote locations with a communications link to the system, network, local area network (LAN), wide area network (WAN), Internet, satellite-link, and/or radio, among other means.

The user-interface 205 may also include a display 220 for visually presenting information to the user in textual, graphic, or video form. The display 220 may also be utilized by the user to input drilling parameters, limits, or set point data in conjunction with the input mechanism 215. For example, the input mechanism 215 may be integral to or otherwise communicably coupled with the display 220.

The BHA 170 may include one or more sensors, typically a plurality of sensors, located and configured about the BHA to detect parameters relating to the drilling environment, the BHA condition and orientation, and other information. In the embodiment shown in FIG. 2, the BHA 170 includes an optional MWD casing pressure sensor 230 that is configured to detect an annular pressure value or range at or near the MWD portion of the BHA 170. The casing pressure data detected via the MWD casing pressure sensor 230 may be sent via electronic signal to the controller 210 via wired or wireless transmission.

The BHA 170 may also include an MWD shock/vibration sensor 235 that is configured to detect shock and/or vibration in the MWD portion of the BHA 170. The shock/vibration data detected via the MWD shock/vibration sensor 235 may be sent via electronic signal to the controller 210 via wired or wireless transmission.

The BHA 170 may also include a mud motor ΔP sensor 240 that is configured to detect a pressure differential value or range across the mud motor of the BHA 170. The pressure differential data detected via the mud motor ΔP sensor 240 may be sent via electronic signal to the controller 210 via wired or wireless transmission. The mud motor ΔP may be alternatively or additionally calculated, detected, or otherwise determined at the surface, such as by calculating the difference between the surface standpipe pressure just off-bottom and pressure once the bit touches bottom and starts drilling and experiencing torque.

The BHA 170 may also include a magnetic toolface sensor 245 and a gravity toolface sensor 250 that are cooperatively configured to detect the current toolface. The magnetic toolface sensor 245 may be or include a conventional or future-developed magnetic toolface sensor which detects toolface orientation relative to magnetic north or true north. The gravity toolface sensor 250 may be or include a conventional or future-developed gravity toolface sensor that detects toolface orientation relative to the Earth's gravitational field. In an exemplary embodiment, the magnetic toolface sensor 245 may detect the current toolface when the end of the wellbore is less than about 7° from vertical, and the gravity toolface sensor 250 may detect the current toolface when the end of the wellbore is greater than about 7° from vertical. However, other toolface sensors may also be utilized within the scope of the present disclosure that may be more or less precise or have the same degree of precision, including non-magnetic toolface sensors and non-gravitational inclination sensors. In any case, the toolface orientation detected via the one or more toolface sensors (e.g., sensors 245 and/or 250) may be sent via electronic signal to the controller 210 via wired or wireless transmission.

The BHA 170 may also include an MWD torque sensor 255 that is configured to detect a value or range of values for torque applied to the bit by the motor(s) of the BHA 170. The torque data detected via the MWD torque sensor 255 may be sent via electronic signal to the controller 210 via wired or wireless transmission.

The BHA 170 may also include an MWD weight-on-bit (WOB) sensor 260 that is configured to detect a value or range of values for WOB at or near the BHA 170. The WOB data detected via the MWD WOB sensor 260 may be sent via electronic signal to the controller 210 via wired or wireless transmission.

The top drive 140 includes a surface torque sensor 265 that is configured to detect a value or range of the reactive torsion of the quill 145 or drill string 155. The torque sensor can also be utilized to detect the torsional resonant frequency of the drill string by applying a Fast Fourier Transform (FFT) on the torque signal while rotary drilling. The top drive 140 also includes a quill position sensor 270 that is configured to detect a value or range of the rotational position of the quill, such as relative to true north or another stationary reference. The surface torsion and quill position data detected via sensors 265 and 270, respectively, may be sent via electronic signal to the controller 210 via wired or wireless transmission. In FIG. 2, the top drive 140 also is associated with a controller 275 and/or other means for controlling the rotational position, speed and direction of the quill 145 or other drill string component coupled to the top drive 140 (such as the quill 145 shown in FIG. 1). Depending on the embodiment, the controller 275 may be integral with or may form a part of the controller 210.

The controller 210 is configured to receive detected information (i.e., measured or calculated) from the user-interface 205, the BHA 170, and/or the top drive 140, and utilize such information to continuously, periodically, or otherwise operate to determine an operating parameter having improved effectiveness. The controller 210 may be further configured to generate a control signal, such as via intelligent adaptive control, and provide the control signal to the top drive 140 to adjust and/or maintain the BHA orientation.

Moreover, as in the exemplary embodiment depicted in FIG. 2, the controller 275 of the top drive 140 may be configured to generate and transmit a signal to the controller 210. Consequently, the controller 275 of the top drive 140 may be configured to influence the control of the BHA 170 to assist in mitigating or avoiding stick-slip conditions. Such cooperation may be independent of control provided to or from the controller 210 and/or the BHA 170.

Figure 3:
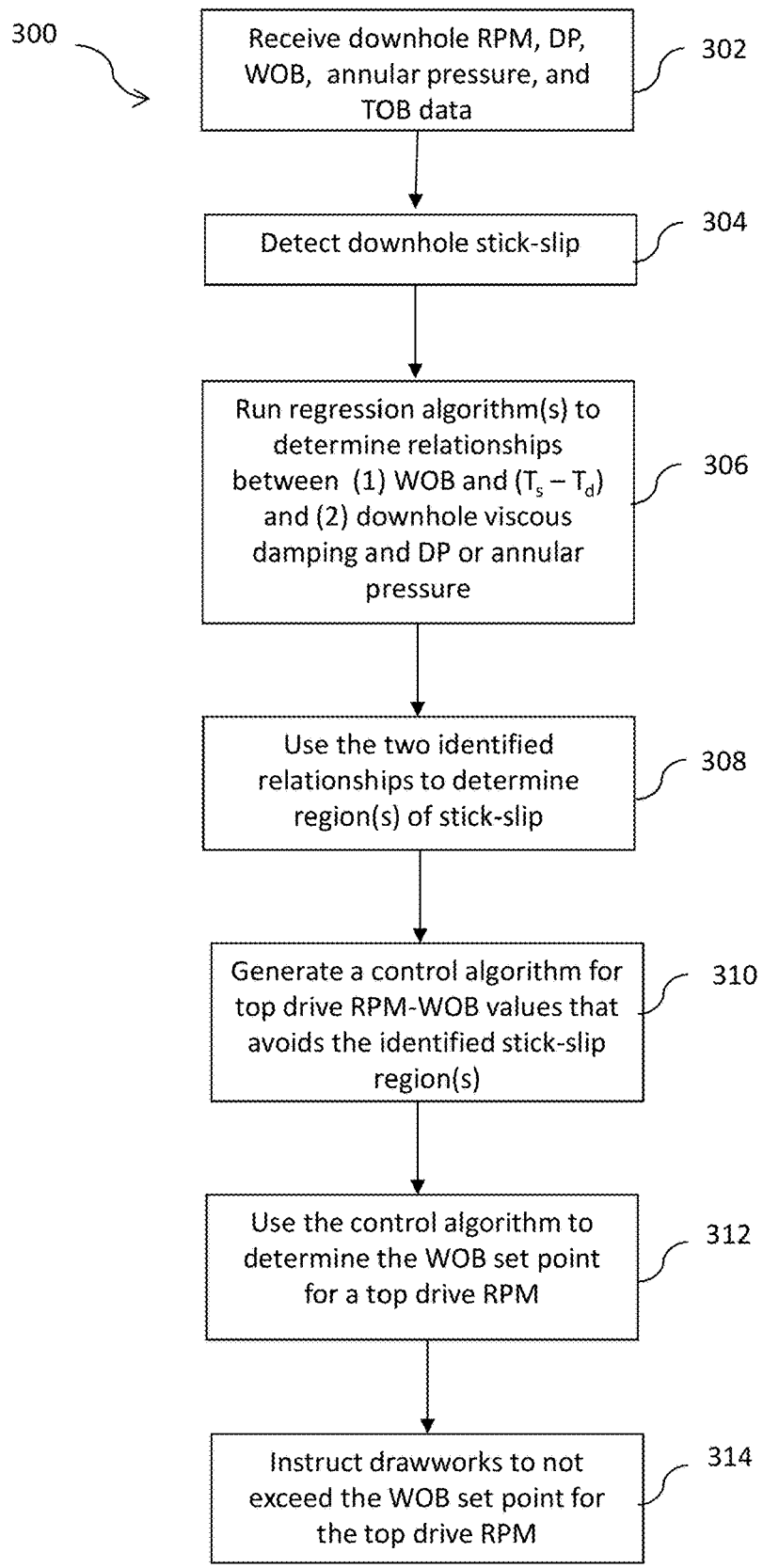
FIG. 3 is an exemplary flow chart showing an exemplary process of reducing stick-slip according to one or more aspects of the present disclosure.

FIG. 3 is a flow chart showing an exemplary method 300 of reducing stick-slip according to aspects of the present disclosure. The method 300 may be performed, for example, with respect to the controller 190 and the apparatus 100 components discussed above with respect to FIG. 1. It is understood that additional steps can be provided before, during, and after the steps of method 300.

At block 302, the controller 190 receives the following data from downhole sensors: bit RPM, DP, WOB, annular pressure, and TOB. For example, the controller 190 receives the rotary speed of the BHA from speed sensor 170e, the DP from mud motor DP sensor 172a, the WOB from WOB sensor 170d, the annular pressure from annular pressure sensor 170a, and the TOB from torque sensor 172b.

At block 304, the controller 190 detects downhole stick-slip conditions. In some embodiments, stick-slip is detected based on the data received in block 302. Stick-slip can be detected from downhole information (e.g., WOB, RPM, and/or TOB information). For example, in the event of stick-slip, downhole RPMs are greater (e.g., 3-5 times) than average surface RPMs. Stick-slip conditions can be detected in a variety of ways, as is known in the art. According to one embodiment, the controller 190 measures the power density spectrum (or the FFT) on the surface torque signal. For example, when there is a spike in the power density (or the power density exceeds a threshold value), stick-slip conditions exist. Another method used at the surface to detect stick-slip conditions is to take a moving time window of torque readings then perform the following calculation: (Max Torque-Min Torque)/(Average Torque). Stick-Slip conditions may also be detected using a microcontroller of the MWD tool by applying FFT on the RPM.

For stick-slip to occur, a well-known inequality needs to be satisfied that includes the following variables:
the downhole viscous damping in Nms ("c"),
the drill string stiffness in N/m ("k"),
the inertia of the BHA, in kgm² ("$J_{BHA}$"),
the rotary speed or RPM at the surface, in rad/sec ("Ω"),
the static friction TOB, in Nm ("$T_s$"), and
the dynamic friction TOB, in Nm ("$T_d$").

A high WOB results in a high ($T_s$-$T_d$). Low damping leads to a small c. A long, slim drillstring leads to a low k. A light BHA results in a small $J_{BHA}$. A low rotary speed leads to a small Ω. Accordingly, any and all of these specific drilling parameters can lead to stick-slip.

At block 306, upon detection of stick-slip, the controller 190 is triggered to run regression algorithms to determine the relationships between (1) ($T_s$-$T_d$) and WOB and (2) c and DP or annular pressure. In several embodiments, both linear and non-linear regression algorithms are run.

Regression analysis is typically used for prediction and forecasting. For example, it is used to estimate the relationships among variables, and includes many techniques for modeling and analyzing several variables. Regression analysis helps determine how the value of a variable changes when another variable is varied. In the present case, the effect of WOB on ($T_s$-$T_d$), and the effect of DP or annular pressure on c is determined.

Figure 4:
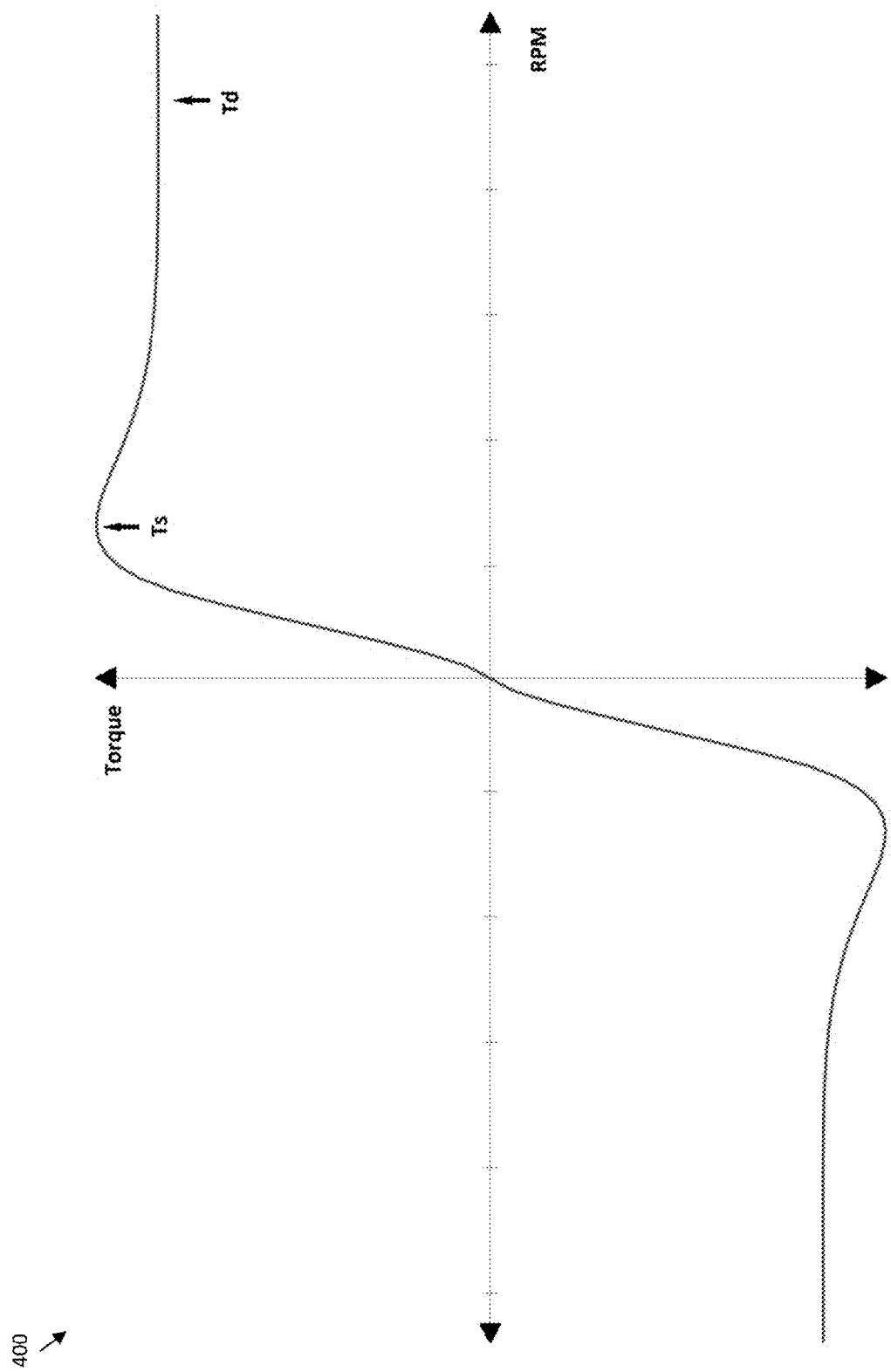
FIG. 4 is an exemplary graph of torque versus RPM according to one or more aspects of the present disclosure.

In several embodiments, the controller 190 receives WOB data from WOB sensor 170d, and then calculates the corresponding ($T_s$-$T_d$). In one embodiment, $T_s$ and $T_d$ are calculated based on measured values of TOB and bit RPM. For example, measured values of TOB are graphed against bit RPM. FIG. 4 provides an exemplary graph 400 of torque vs. RPM, showing when $T_s$ and $T_d$ are reached. Once the torque sensor 172b detects some rotary speed at the bit, the TOB (which corresponds to $T_s$) is collected. Once the torque sensor 172b detects a rotary speed greater than a threshold value, the TOB (which corresponds to $T_d$) is collected. The difference between $T_s$ and $T_d$ is then calculated by the controller 190.

Once there are several WOB-($T_s$-$T_d$) values generated, the controller 190 runs regression algorithms. In one embodiment, a linear regression analysis is performed, and an equation (e.g., y=mx+b) relating WOB and ($T_s$-$T_d$) is formulated. In other embodiments, a non-linear regression analysis is performed to formulate an equation (e.g., y=mx²+nx+b) relating WOB and ($T_s$-$T_d$).

In various embodiments, the controller 190 receives DP data from mud motor pressure sensor 172a or annular pressure data from annular pressure sensor 170a and calculates corresponding values of c. The values for c may be estimated from measured downhole bit RPM values when the bit just starts rotating off bottom and using a logarithmic decrement formula. For example, $$\zeta (\text{damping ratio}) = \frac{c}{2\sqrt{kJBHA}} \quad \text{(Equation 1)}$$

The damping ratio can be estimated from known formulas that include the following variables:
the number of cycles in the data captured when off bottom rotation is just started ("N"),
the amplitude of bit RPM at the start of rotating the bit off bottom ("$X_1$"), and
the amplitude of a successive bit RPM after a couple of cycles of off bottom rotation ("$X_{N+1}$").
The values for k and $J_{BHA}$ are known from drill string mechanical properties inputted by an operator (e.g., using pipe tally information and BHA composition)

Thus, bit RPM values can be substituted into the known formulas to calculate values for δ. Values for δ can then be substituted into the known formulas to calculate values of ζ, and values of ζ can be substituted into Equation 1 to calculate values for c.

Similar to the description for finding the relationship between WOB and ($T_s$-$T_d$), once there are several DP or annular pressure-c values generated, the controller 190 runs regression algorithms (e.g., linear and/or non-linear algorithms) to determine the relationship between DP or annular pressure and c.

At block 308, the controller 190 uses the two identified relationships, BHA information, and drill string information to identify and model the stick-slip region(s). For example, real-time drilling data of DP, annular pressure, top drive RPM, WOB, as well as drill string stiffness and BHA inertia, are used to determine when the left side of the inequality is less than the right side, resulting in stick-slip. Measured values of WOB are input into the equation relating WOB to ($T_s-T_d$) to calculate ($T_s-T_d$) values that can be plugged into the inequality. Measured values of DP or annular pressure are input into the equation relating pressure and c to calculate c values that can be plugged into the inequality.

In several embodiments, these values are used to generate a two dimensional graph of WOB versus top drive RPM to determine regions of stick-slip. That is, what top drive RPM-WOB values make the inequality true and result in stick-slip can be graphed or plotted.

Figure 5:
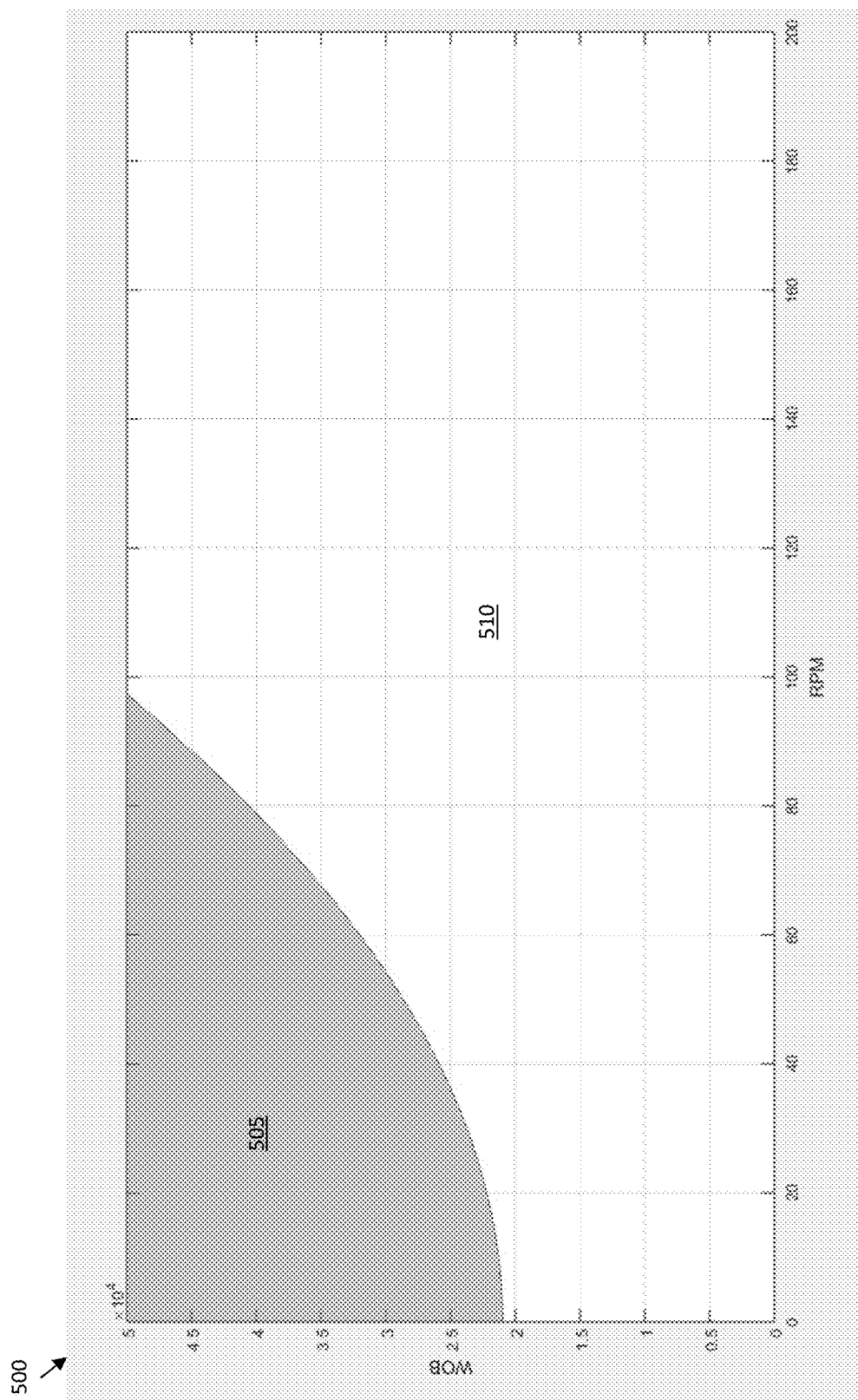
FIG. 5 is an exemplary graph showing a stick-slip region according to one or more aspects of the present disclosure.

FIG. 5 illustrates an exemplary plot 500 of the inequality, which shows the stick-slip region 505 and non stick-slip region 510 for a particular drilling operation. As shown in FIG. 5, the stick-slip region 505 and the non stick-slip region 510 encompasses certain top drive RPMs and WOBs. The more top drive RPM commanded, the more WOB an operator is allowed to apply until a desired WOB and RPM is reached (e.g., following the contour lines away from the stick-slip region 505).

At block 310, the controller 190 generates a control algorithm or equation for top drive RPM-WOB values that avoids the identified stick-slip region(s). In various embodiments, the control algorithm corresponds to a line or curve that is just below the stick-slip region(s). In some embodiments, the controller 190 schedules the top drive RPM-WOB relationship around regions of severe stick-slip.

At block 312, the controller 190 uses the control algorithm generated at block 310 to determine the WOB auto-driller set point for a specific top drive RPM commanded. That is, a maximum WOB to be used with a particular top drive RPM is determined so that stick-slip conditions are avoided. For example, if a top drive RPM of 100 is commanded by the controller 190, the controller 190 inputs the top drive RPM into the control algorithm to output the maximum WOB that can be used with that RPM.

At block 314, the controller 190 instructs the drawworks 130 to not exceed the WOB set point at that particular top drive RPM to reduce or eliminate instances of stick-slip. In certain embodiments, the controller 190 detects that the WOB is greater than the WOB set point, and instructs the drawworks 130 to adjust the WOB to a lesser value. In other embodiments, controller 190 detects that the WOB is less than the WOB set point, and instructs the drawworks 130 to adjust the WOB to a greater value.

Figure 6:
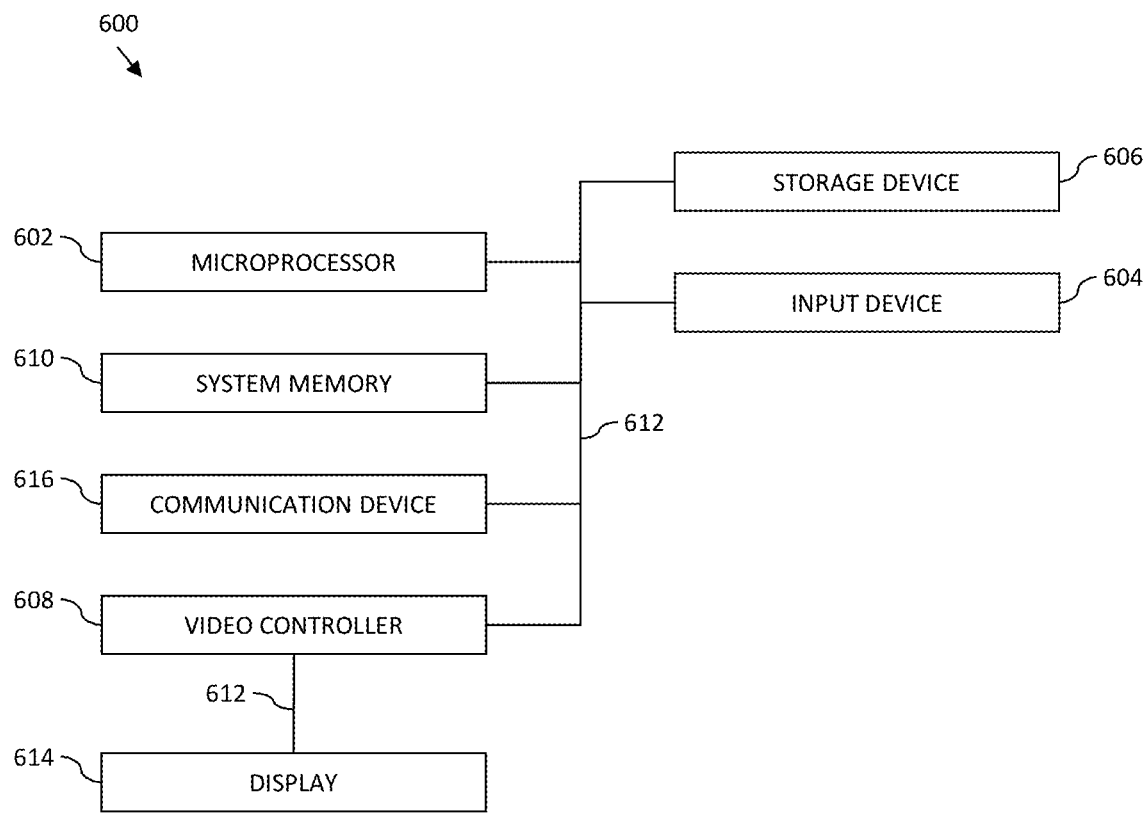
FIG. 6 is a diagram of an exemplary system for implementing one or more embodiments of the described apparatuses, systems, or methods according to one or more aspects of the present disclosure.

Referring now to FIG. 6, illustrated is an exemplary system 600 for implementing one or more embodiments of at least portions of the apparatuses and/or methods described herein. The system 600 includes a processor 602, an input device 604, a storage device 606, a video controller 608, a system memory 610, a display 614, and a communication device 616, all interconnected by one or more buses 612. The storage device 606 may be a floppy drive, hard drive, CD, DVD, optical drive, or any other form of storage device. In addition, the storage device 606 may be capable of receiving a floppy disk, CD, DVD, or any other form of computer-readable medium that may contain computer-executable instructions. Communication device 616 may be a modem, network card, wireless router, or any other device to enable the system 600 to communicate with other systems.

A computer system typically includes at least hardware capable of executing machine readable instructions, as well as software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, PDAs, and personal computing devices (PCDs), for example). Furthermore, hardware typically includes any physical device that is capable of storing machine-readable instructions, such as memory or other data storage devices. Other forms of hardware include hardware sub-systems, including transfer devices such as modems, modem cards, ports, and port cards, for example. Hardware may also include, at least within the scope of the present disclosure, multi-modal technology, such as those devices and/or systems configured to allow users to utilize multiple forms of input and output—including voice, keypads, and stylus—interchangeably in the same interaction, application, or interface.

Software may include any machine code stored in any memory medium, such as RAM or ROM, machine code stored on other devices (such as floppy disks, CDs or DVDs, for example), and may include executable code, an operating system, as well as source or object code, for example. In addition, software may encompass any set of instructions capable of being executed in a client machine or server—and, in this form, is often called a program or executable code.

Hybrids (combinations of software and hardware) are becoming more common as devices for providing enhanced functionality and performance to computer systems. A hybrid may be created when what are traditionally software functions are directly manufactured into a silicon chip—this is possible since software may be assembled and compiled into ones and zeros, and, similarly, ones and zeros can be represented directly in silicon. Typically, the hybrid (manufactured hardware) functions are designed to operate seamlessly with software. Accordingly, it should be understood that hybrids and other combinations of hardware and software are also included within the definition of a computer system herein, and are thus envisioned by the present disclosure as possible equivalent structures and equivalent methods.

Computer-readable mediums may include passive data storage such as a random access memory (RAM), as well as semi-permanent data storage such as a compact disk or DVD. In addition, an embodiment of the present disclosure may be embodied in the RAM of a computer and effectively transform a standard computer into a new specific computing machine.

Data structures are defined organizations of data that may enable an embodiment of the present disclosure. For example, a data structure may provide an organization of data or an organization of executable code (executable software). Furthermore, data signals are carried across transmission mediums and store and transport various data structures, and, thus, may be used to transport an embodiment of the invention. It should be noted in the discussion herein that acts with like names may be performed in like manners, unless otherwise stated.

The controllers and/or systems of the present disclosure may be designed to work on any specific architecture. For example, the controllers and/or systems may be executed on one or more computers, Ethernet networks, local area networks, wide area networks, internets, intranets, hand-held and other portable and wireless devices and networks.

In view of all of the above and the figures, one of ordinary skill in the art will readily recognize that the present disclosure relates to systems and methods for reducing or eliminating stick-slip. In one aspect, the present disclosure is directed to a system that includes a controller and a drawworks. The controller is configured to collect downhole bit rotary speed (RPM), weight on bit (WOB), torque on bit (TOB), annular pressure, and differential pressure (DP) data, detect one or more stick-slip conditions, determine a correlative relationship between: (1) WOB and the difference between static friction TOB and dynamic friction TOB, and (2) downhole viscous damping and DP or annular pressure, model a stick-slip region using the determined relationships for (1) and (2), generate a control algorithm for top drive RPM and WOB that avoids the stick-slip region, determine a WOB autodriller set point for a particular top drive RPM using the control algorithm, and provide one or more operational control signals that limit the WOB to the WOB autodriller set point for the particular top drive RPM. The drawworks is configured to receive the one or more operational control signals from the controller, and limit the WOB so that the WOB does not exceed the WOB autodriller set point for the particular top drive RPM.

In a second aspect, the present disclosure is directed to a method of reducing stick-slip in a drill bit. The method includes determining, by a controller, relationships for: (1) weight on bit (WOB) and the difference between static friction torque on bit (TOB) and dynamic friction TOB, and (2) downhole viscous damping and differential pressure (DP) or annular pressure, generating, by the controller, a graph of a stick-slip region using a well-known inequality that includes the following variables:

the downhole viscous damping in Nms ("c"), the drill string stiffness in N/m ("k"), the inertia of the BHA, in kgm² ("$J_{BHA}$"), the rotary speed (RPM) at the surface, in rad/sec ("Ω"), the static friction TOB, in Nm ("$T_s$"), and the dynamic friction TOB, in Nm ("$T_d$"), and the determined relationships for (1) and (2), generating, by the controller, a control algorithm that avoids the stick-slip region; determining, by the controller, a WOB autodriller set point for a particular top drive RPM using the control algorithm; and instructing a drawworks to limit a WOB to the WOB autodriller set point for the particular top drive RPM.

In a third aspect, the present disclosure is directed to a non-transitory machine-readable medium having stored thereon machine-readable instructions executable to cause a machine to perform operations. The operations include determining, using regression analysis, relationships for: (1) weight on bit (WOB) and the difference between static friction torque on bit (TOB) and dynamic friction TOB, and (2) downhole viscous damping and differential pressure (DP) or annular pressure, modeling a stick-slip region using the determined relationships for (1) and (2) and a well-known inequality that includes the following variables:

the downhole viscous damping in Nms ("c"), the drill string stiffness in N/m ("k"), the inertia of the BHA, in kgm² ("$J_{BHA}$"), the rotary speed (RPM) at the surface, in rad/sec ("Ω"), the static friction TOB, in Nm ("$T_s$"), and the dynamic friction TOB, in Nm ("$T_d$"), generating a control algorithm that avoids the stick-slip region; limiting a WOB autodriller set point for a particular top drive RPM using the control algorithm, detecting that a WOB at the particular top drive RPM is less than or greater than the WOB autodriller set point, and instructing a drawworks to increase or decrease the WOB at the particular top drive RPM. The foregoing outlines features of several embodiments so that a person of ordinary skill in the art may better understand the aspects of the present disclosure. Such features may be replaced by any one of numerous equivalent alternatives, only some of which are disclosed herein. One of ordinary skill in the art should appreciate that they may readily use the present disclosure as a basis for designing or modifying other processes and structures for carrying out the same purposes and/or achieving the same advantages of the embodiments introduced herein. One of ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

Moreover, it is the express intention of the applicant not to invoke 35 U.S.C. § 112(f) for any limitations of any of the claims herein, except for those in which the claim expressly uses the word "means" together with an associated function.

What is claimed is:

1. A system, comprising:
    a controller configured to:
        collect downhole bit rotary speed (RPM), weight on bit (WOB), torque on bit (TOB), annular pressure, and differential pressure (DP) data,
        detect one or more stick-slip conditions,
        determine a correlative relationship between:
            (1) WOB and the difference between static friction TOB and dynamic friction TOB, and
            (2) downhole viscous damping and DP or annular pressure,
        model a stick-slip region using the determined relationships for (1) and (2),
        generate a control algorithm for top drive RPM and WOB that avoids the stick-slip region,
        determine a WOB autodriller set point for a particular top drive RPM using the control algorithm, and
        provide one or more operational control signals that limit the WOB to the WOB autodriller set point for the particular top drive RPM; and
    a drawworks configured to:
        receive the one or more operational control signals from the controller, and
        limit the WOB so that the WOB does not exceed the WOB autodriller set point for the particular top drive RPM.

2. The system of claim 1, wherein the controller is further configured to use at least one of the collected downhole RPM, DP, annular pressure, WOB, and TOB data to detect the one or more stick-slip conditions.

3. The system of claim 1, wherein the controller is further configured to calculate the static friction TOB and the dynamic TOB based on the collected TOB and bit RPM data.

4. The system of claim 1, wherein the controller is further configured to calculate downhole viscous damping data based on the collected bit RPM data.

5. The system of claim 1, wherein determining the relationships for (1) and (2) comprises running linear regression algorithms, non-linear regression algorithms, or both.

6. The system of claim 1, wherein the controller is further configured to calculate drill string stiffness (k) and inertia of a bottom hole assembly based on operator input.

7. The system of claim 1, wherein the controller is further configured to show the stick-slip region on a graph and display the graph to a user.

8. The system of claim 1, wherein the control algorithm corresponds to a line or curve that is below the stick-slip region.

9. A method of reducing stick-slip in a drill bit, which comprises:
    determining, by a controller, relationships for:

(1) weight on bit (WOB) and the difference between static friction torque on bit (TOB) and dynamic friction TOB, and
(2) downhole viscous damping and differential pressure (DP) or annular pressure, generating, by the controller, a graph of a stick-slip region using the determined relationships for (1) and (2), generating, by the controller, a control algorithm that avoids the stick-slip region;

determining, by the controller, a WOB autodriller set point for a particular top drive rotary speed (RPM) using the control algorithm; and instructing a drawworks to limit a WOB to the WOB autodriller set point for the particular top drive RPM.

10. The method of claim 9, further comprising detecting one or more stick-slip conditions based on at least one of received downhole RPM, DP, WOB and dynamic friction and static friction TOB data.

11. The method of claim 9, wherein determining the relationships for (1) and (2) comprises running linear regression algorithms, non-linear regression algorithms, or both.

12. The method of claim 9, further comprising calculating the static TOB and the dynamic TOB based on measured TOB and bit RPM data.

13. The method of claim 9, further comprising calculating the downhole viscous damping based on measured bit RPM data.

14. The method of claim 9, wherein the graph comprises a two-dimensional plot of WOB versus top drive RPM.

15. A non-transitory machine-readable medium having stored thereon machine-readable instructions executable to cause a machine to perform operations that, when executed, comprise:

determining, using regression analysis, relationships for:
(1) weight on bit (WOB) and the difference between static friction torque on bit (TOB) and dynamic friction TOB, and
(2) downhole viscous damping and differential pressure (DP) or annular pressure, generating a control algorithm that avoids the stick-slip region;

limiting a WOB autodriller set point for a particular top drive rotary speed (RPM) using the control algorithm, detecting that a WOB at the particular top drive RPM is less than or greater than the WOB autodriller set point, and instructing a drawworks to increase or decrease the WOB at the particular top drive RPM.

16. The non-transitory machine-readable medium of claim 15, wherein the operations further comprise calculating the static TOB and the dynamic TOB based on measured values for TOB and bit RPM.

17. The non-transitory machine-readable medium of claim 15, wherein the operations further comprise calculating the downhole viscous damping based on measured values of bit RPM.

18. The non-transitory machine-readable medium of claim 15, wherein the operations further comprise showing the stick-slip region on a plot and displaying the plot to a user.

19. The non-transitory machine-readable medium of claim 18, wherein the plot comprises a two-dimensional plot of WOB versus top drive RPM.

* * * * *